(12) United States Patent
Kiuchi et al.

(10) Patent No.: US 7,098,276 B1
(45) Date of Patent: Aug. 29, 2006

(54) FLAME-RETARDANT EPOXY RESIN COMPOSITION AND SEMICONDUCTOR DEVICE MADE USING THE SAME

(75) Inventors: Yukihiro Kiuchi, Tokyo (JP); Masatoshi Iji, Tokyo (JP); Katsushi Terajima, Tokyo (JP); Isao Katayama, Tokyo (JP); Yasuo Matsui, Tokyo (JP); Ken Oota, Tokyo (JP)

(73) Assignees: NEC Corporation, Tokyo (JP); Sumitomo Bakelite Company, Tokyo (JP)

( * ) Notice: Subject to any disclaimer, the term of this patent is extended or adjusted under 35 U.S.C. 154(b) by 0 days.

(21) Appl. No.: 09/830,016

(22) PCT Filed: Oct. 20, 1999

(86) PCT No.: PCT/JP99/05787

§ 371 (c)(1),
(2), (4) Date: Apr. 20, 2001

(87) PCT Pub. No.: WO00/23494

PCT Pub. Date: Apr. 27, 2000

(51) Int. Cl.
C08K 3/36 (2006.01)
C08L 61/10 (2006.01)
C08L 63/00 (2006.01)

(52) U.S. Cl. ............ 525/481; 523/427; 523/457; 523/466

(58) Field of Classification Search ............ 523/466, 523/427; 525/481; 257/793
See application file for complete search history.

(56) References Cited

U.S. PATENT DOCUMENTS

| | | | | |
|---|---|---|---|---|
| 5,075,357 A | * | 12/1991 | Enami et al. | 523/466 |
| 5,312,878 A | * | 5/1994 | Shiobara et al. | 525/507 |
| 5,416,138 A | | 5/1995 | Mogi et al. | 523/466 |
| 5,798,400 A | * | 8/1998 | Tokunaga et al. | 523/443 |
| 5,854,316 A | * | 12/1998 | Shimizu et al. | 523/442 |
| 6,054,222 A | * | 4/2000 | Takami et al. | 428/417 |
| 6,160,078 A | * | 12/2000 | Osada et al. | 528/104 |

FOREIGN PATENT DOCUMENTS

| | | |
|---|---|---|
| EP | 0 450 944 A2 | 10/1991 |
| EP | 0 589 143 A2 | 3/1994 |
| EP | 0 915 118 A1 | 5/1999 |
| JP | 57038814 A * | 3/1982 |
| JP | 58150581 A * | 9/1983 |
| JP | A 3-210322 | 9/1991 |
| JP | A 3-243616 | 10/1991 |
| JP | A 4-258624 | 9/1992 |
| JP | 5-67702 | 3/1993 |
| JP | 5-97965 | 4/1993 |
| JP | 5-170875 | 7/1993 |
| JP | 5-175364 | 7/1993 |
| JP | 6-326221 | 11/1994 |
| JP | 7-130919 | 5/1995 |
| JP | 7-153873 | 6/1995 |
| JP | 7-216059 | 8/1995 |
| JP | 7-238141 | 9/1995 |
| JP | 8-245754 | 9/1996 |
| JP | 8-253551 | 10/1996 |
| JP | 8-253555 A * | 10/1996 |
| JP | 8-301984 A * | 11/1996 |
| JP | 8-333428 | 12/1996 |
| JP | 09003161 A * | 1/1997 |
| JP | 9-208808 A * | 8/1997 |
| JP | 09268219 A * | 10/1997 |
| JP | 10-53694 | 2/1998 |
| JP | 10-116941 | 5/1998 |
| JP | 10-130468 | 5/1998 |
| JP | 10-182941 A * | 7/1998 |
| JP | 11-140277 | 5/1999 |
| JP | 2000-103839 | 4/2000 |

* cited by examiner

Primary Examiner—Robert Sellers
(74) Attorney, Agent, or Firm—Young & Thompson

(57) ABSTRACT

An epoxy resin composition which can be used as a semiconductor encapsulating resin and in which the improvement of flame retardancy can be attained by suitably adapting a crosslinked structure itself of a cured article without using any flame retardant material and without particularly highly filling an inorganic filler. The epoxy resin composition includes an epoxy resin (A), a phenolic resin (B), an inorganic filler (C) and a curing accelerator (D), wherein a flexural modulus E (kgf/mm$^2$) at 240±20% C of a cured article obtained by curing the composition is a value satisfying $0.015\ W+4.1 \leq E \leq 0.27\ W+21.8$ in the case of $30 \leq W < 60$, or a value satisfying $0.30\ W-13 \leq E \leq 3.7\ W-184$ in the case of $60 \leq W \leq 95$ wherein W (wt %) is a content of the inorganic filler (C) in the cured article. The cured article of this composition forms a foamed layer during thermal decomposition or at ignition to exert flame retardancy.

6 Claims, 1 Drawing Sheet

● : Examples
× : Comparative Examples

FLAME-RETARDANT EPOXY RESIN COMPOSITION AND SEMICONDUCTOR DEVICE MADE USING THE SAME

FIELD OF THE INVENTION

The present invention relates to an epoxy resin composition which can suitably be used as a semiconductor encapsulating resin, and more specifically, it relates to a flame retardant epoxy resin composition which is excellent in flame retardancy and reliability as a semiconductor encapsulating resin, particularly resistance to crack due to soldering, humidity resistance and wire corrosion resistance at a high temperature. Furthermore, the present invention relates to a semiconductor device in which the above flame retardant epoxy resin composition is used.

BACKGROUND TO THE INVENTION

Heretofore, electronic parts such as diodes, transistors and integrated circuits have been mainly encapsulated with epoxy resin compositions. In order to secure safety, it is required as obligation by UL standards to impart flame retardancy to the epoxy resin composition which can be used as this semiconductor encapsulating resin. Accordingly, the above epoxy resin composition is usually blended with a halogen-based flame retardant material as a flame retardant material and diantimony trioxide as a flame retardant auxiliary. However, with the increase of consciousness regarding environmental problems in recent years, a high safety is required for the flame retardant material and the flame retardant auxiliary which are used in the encapsulating resins of various kinds of semiconductor devices.

The halogen-based flame retardant material generates a harmful halogen-based gas and the like during combustion, and there is anxiety that diantimony trioxide which is the flame retardant auxiliary has chronic toxicity. Accordingly, environmental and sanitary problems of the flame retardant material and the flame retardant auxiliary have been indicated, and so it is now considered that the conventional semiconductor encapsulating resins are insufficient for the safety. In addition, a halogen and antimony derived from the above flame retardant material and flame retardant auxiliary accelerate the corrosion of wires in the semiconductor device at a high temperature, particularly the corrosion of an interface between a gold (Au) wire and an aluminum (Al) pad (an interface between different kinds of metals) and the like, so that contact resistance between the Au wire and the Al pad increases. In consequence, a phenomenon such as wire breakage occurs, which causes the reliability of the semiconductor device, particularly wire corrosion resistance to lower at the high temperature. Therefore, it has been required to develop the epoxy resin composition for semiconductor encapsulate which is excellent the flame retardancy and reliability without using the halogen-based flame retardant material and diantimony trioxide.

For the above requirement, phosphorus-based flame retardant materials such as red phosphorus and phosphates, which have now been begun to be used in some fields, are useful to make the epoxy resin composition flame retardant, but each of these compounds tends to react with a trace amount of water to produce phosphine and corrosive phosphoric acids, and hence, humidity resistance is poor. Therefore, these phosphorus-based flame retardant materials are not suitable for the encapsulation of electronic parts in which humidity resistance is strictly required.

Furthermore, it has also been investigated to use metallic hydroxides such as aluminum hydroxide and magnesium hydroxide as well as boron-based compounds as the flame retardant materials, but unless each of these metallic hydroxides and boron-based compounds is used in large quantity to the epoxy resin composition, a sufficient flame retardant effect cannot be exerted. However, if a large amount of such a flame retardant material is added, the moldability of the epoxy resin composition deteriorates inconveniently.

In place of the use of the above halogen-based or phosphorus-based flame retardant material, there have been suggested an epoxy resin composition for encapsulating a semiconductor and a semiconductor device in which an inorganic filler is highly filled into the epoxy resin composition in a high ratio of, e.g., 87 to 95 wt % to improve the flame retardancy (Japanese Patent Application Laid-Open No. 301984/1996), and an epoxy resin composition and a semiconductor encapsulating device in which the inorganic filler is highly filled into the epoxy resin composition in a ratio of 83 vol % (91 wt % in terms of spherical silica powder) or more to improve burning resistance (Japanese Patent Application Laid-Open No. 208808/1997). In each of these epoxy resin compositions, however, the inorganic filler is highly filled, and hence, the moldability of the epoxy resin composition which is used to encapsulate the semiconductor device is inconveniently poor.

On the contrary, with regard to a technique of making the resin itself flame retardant without adding any flame retardant material, it has been heretofore mainly investigated to improve the heat resistance (thermal decomposition resistance) of a resin structure constituting a cured article of the epoxy resin. Such a technique can increase the density of a crosslinked structure formed by a curing reaction between resin components such as an epoxy resin and a phenolic resin in the cured article of the epoxy resin, whereby the molecular vibration of these resin components which occurs during heating and at ignition is limited. In consequence, the thermal decomposition of these resin components can be inhibited, and the amount of a decomposition gas including combustible components generated in such a case can be reduced, so that the combustion of the resin components is minimized to improve the flame retardancy of the cured article of the epoxy resin. However, as a result of the investigation of this technique, the sufficient flame retardancy could not be obtained.

SUMMARY OF THE INVENTION

The present invention has been developed in view of the above inconveniences, and an object of the present invention is to provide an epoxy resin composition in which the improvement of flame retardancy can be attained by suitably adapting a crosslinked structure itself of a cured article of the above composition without using any flame retardant material and without highly filling an inorganic filler. The cured article of this flame retardant epoxy resin composition can form a foamed layer, which can retard heat transfer and oxygen passage to an unburned portion, during thermal decomposition or at ignition to exert the high flame retardancy, and is excellent in reliability as a semiconductor encapsulating resin, for example, resistance to crack due to soldering, humidity resistance and particularly wire corrosion resistance at a high temperature. Furthermore, another object of the present invention is to provide a semiconductor device in which the above flame retardant epoxy resin composition is used.

In order to achieve the above objects, the present invention provides epoxy resin compositions in the following paragraphs (1) to (4).

(1) An epoxy resin composition comprising an epoxy resin (A), a phenolic resin (B), an inorganic filler (C) and a curing accelerator (D), wherein a flexural modulus E (kgf/mm$^2$) at 240±20° C. of a cured article obtained by curing the composition is a value satisfying 0.015 W+4.1≦E≦0.27 W+21.8 in the case of 30≦W<60, or a value satisfying 0.30 W−13≦E≦3.7 W−184 in the case of 60≦W≦95 wherein W (wt %) is a content of the inorganic filler (C) in the cured article, and the cured article forms a foamed layer during thermal decomposition or at ignition to exert flame retardancy.

(2) An epoxy resin composition comprising an epoxy resin (A), a phenolic resin (B), an inorganic filler (C) and a curing accelerator (D), wherein a content of the inorganic filler (C) in a cured article obtained by curing the composition is represented by W (wt %), and values of $Q_1$ and $Q_2$ represented by the following equations satisfy $Q_1 \geq 5$ and $5 \leq Q_2 \leq 50$, respectively, $$Q_1 \text{ (wt \%)} = (q_1/q_3) \times 100$$

$$Q_2 \text{ (wt \%)} = \{(100-q_1-q_2)/q_3\} \times 100$$

wherein $q_1$ (wt %) is a weight ratio, to the cured article, of carbon monoxide and carbon dioxide generated by placing a heat-resistant container including the weighed cured article in a tubular furnace purged with an inert gas at a constant flow rate to bring the atmosphere in the furnace into an inert state, and then thermally decomposing the cured article at 700±10° C. for 10 minutes; $q_2$ (wt %) is a weight ratio, to the cured article, of a residue at the completion of the thermal decomposition, i.e., the inorganic filler and remains carbonized which are not thermally decomposed among the resin components [components other than the inorganic filler (C)] in the cured article; and $q_3$ (wt %) is a weight ratio of the resin components contained in the cured article to the cured article, and the cured article forms a foamed layer during thermal decomposition or at ignition to exert flame retardancy.

(3) An epoxy resin composition comprising an epoxy resin (A), a phenolic resin (B), an inorganic filler (C) and a curing accelerator (D), wherein a flexural modulus E (kgf/mm$^2$) at 240±20° C. of a cured article obtained by curing the composition is a value satisfying 0.015 W+4.1≦E≦0.27 W+21.8 in the case of 30≦W<60, or a value satisfying 0.30 W−13≦E≦3.7 W−184 in the case of 60≦W≦95 wherein W (wt %) is a content of the inorganic filler (C) in the cured article; and values of $Q_1$ and $Q_2$ represented by the following equations satisfy $Q_1 \geq 5$ and $5 \leq Q_2 \leq 50$, respectively, $$Q_1 \text{ (wt \%)} = (q_1/q_3) \times 100$$

$$Q_2 \text{ (wt \%)} = \{(100-q_1-q_2)/q_3\} \times 100$$

wherein $q_1$ (wt %) is a weight ratio, to the cured article, of carbon monoxide and carbon dioxide generated by placing a heat-resistant container including the weighed cured article in a tubular furnace purged with an inert gas at a constant flow rate to bring the atmosphere in the furnace into an inert state, and then thermally decomposing the cured article at 700±10° C. for 10 minutes; $q_2$ (wt %) is a weight ratio, to the cured article, of a residue at the completion of the thermal decomposition, i.e., the inorganic filler and remains carbonized which are not thermally decomposed among the resin components [components other than the inorganic filler (C)] in the cured article; and $q_3$ (wt %) is a weight ratio of the resin components contained in the cured article to the cured article, and the cured article forms a foamed layer during thermal decomposition or at ignition to exert flame retardancy.

(4) An epoxy resin composition comprising an epoxy resin (A), a phenolic resin (B), an inorganic filler (C) and a curing accelerator (D), wherein a cured article obtained by curing the composition forms a foamed layer during thermal decomposition or at ignition to exert flame retardancy.

Furthermore, the present invention provides a semiconductor device in which the epoxy resin composition described in any one of the above paragraphs (1) to (4) is used as a encapsulating resin.

A flame retardant mechanism of the flame retardant epoxy resin composition according to the present invention will be described hereinafter. A cured article of the epoxy resin composition regarding the present invention can possess a high flame retardancy, and this reason is that when a flexural modulus E of this cured article at a high temperature (240±20° C.) is a value within the predetermined range, a thermal decomposition gas generated in the cured article during thermal decomposition or at ignition expands a layer of the cured article like a rubber to form a foamed layer, so that the cured article shows self-extinguishing characteristics owing to the block of oxygen to an unburned portion and a thermal insulating function by this foamed layer. The above foamed layer is utterly different from such a layer artificially formed by a foam molding method as contained in a phenol foam resin, and it is the layer newly generated during the thermal decomposition or at the ignition of the cured article of the epoxy resin according to the present invention.

On the contrary, when the flexural modulus E is a higher value than the predetermined range, it would be presumed that the layer of the cured article is too hard, so that the decomposition gas generated in the cured article during the thermal decomposition or at the ignition cannot expand the layer of the cured article like the rubber, and instead of forming the foamed layer, some cracks occur in the cured article, with the result that the flame retardancy noticeably deteriorates. Conversely, when the flexural modulus E is a lower value than the predetermined range, it would be presumed that the foamed layer is formed at an early stage of the thermal decomposition or the ignition, but since the layer of the cured article is too soft, the foamed layer easily breaks, so that the whole cured article exhibits a high flowability and a drip phenomenon takes place. In consequence, the combustion continues, which means that the flame retardancy noticeably lowers.

Adjusting the flexural modulus E of the cured article of the epoxy resin at the high temperature (240±20° C.) within the predetermined range in which the foamed layer can be formed during the thermal decomposition or at the ignition can be achieved by a technique of introducing an aromatic moiety and/or a polyaromatic moiety, preferably an aromatic moiety and/or a polyaromatic moiety selected from the group consisting of phenyl derivatives and biphenyl derivatives into a crosslinked structure of the cured article of the epoxy resin. That is to say, when the aromatic moiety and/or the polyaromatic moiety is introduced into the crosslinked structure of the cured article of the epoxy resin, a distance between crosslinking points can be more prolonged than in a cured article of a conventional epoxy resin, so that a free volume in the cured article of the epoxy resin increases at the high temperature during the thermal decomposition or at the ignition. In consequence, the flexural modulus of the resin components in the cured article deteriorates, so that the formation of the foamed layer can be facilitated. Furthermore, it would be presumed that in contrast to a case where another hydrocarbon moiety, for example, a saturated hydrocarbon moiety is introduced, the thermal decomposition of the resin components themselves can be inhibited, whereby the stable formation of the foamed layer is possible.

As described above, the resin layer can be expanded like the rubber by the gas component generated by the decomposition of the resin components during the thermal decomposition or at the ignition to form the foamed layer, but if this decomposition gas breaks the foamed layer and comes out to the outside, a combustible component contained in the decomposition gas, i.e., a low-boiling organic component ignites and the combustion continues. Therefore, the amount of the generated organic component has a large influence on the flame retardancy of the cured article of the epoxy resin. Concretely, when $Q_1 \geq 5$ wherein $Q_1$ (wt %) is a weight ratio, to components (resin components) other than an inorganic filler (C), of carbon monoxide and carbon dioxide (i.e., non-organic components in the decomposition gas) generated by placing a heat-resistant container including the weighed cured article in a tubular furnace purged with an inert gas at a constant flow rate to bring the atmosphere in the furnace into an inert state, and then thermally decomposing the cured article at 700±10° C. for 10 minutes, and when $5 \leq Q_2 \leq 50$ wherein $Q_2$ (wt %) is a weight ratio, to the resin components, of gas components (i.e., organic components in the decomposition gas) other than carbon monoxide and carbon dioxide generated from the above resin components, a possibility that the decomposition gas ignites and the combustion continues is low, which means that the flame retardancy is good.

On the contrary, if the values of $Q_1$ and $Q_2$ are less than the above ranges, the resin layer of the cured article does not foam sufficiently, so that the flame retardancy lowers. Conversely, if the value of $Q_2$ is more than the above ranges, the possibility that the decomposition gas ignites and the combustion continues is high, which means that the flame retardancy is poor.

DETAILED DESCRIPTION OF THE INVENTION

Figure 1:
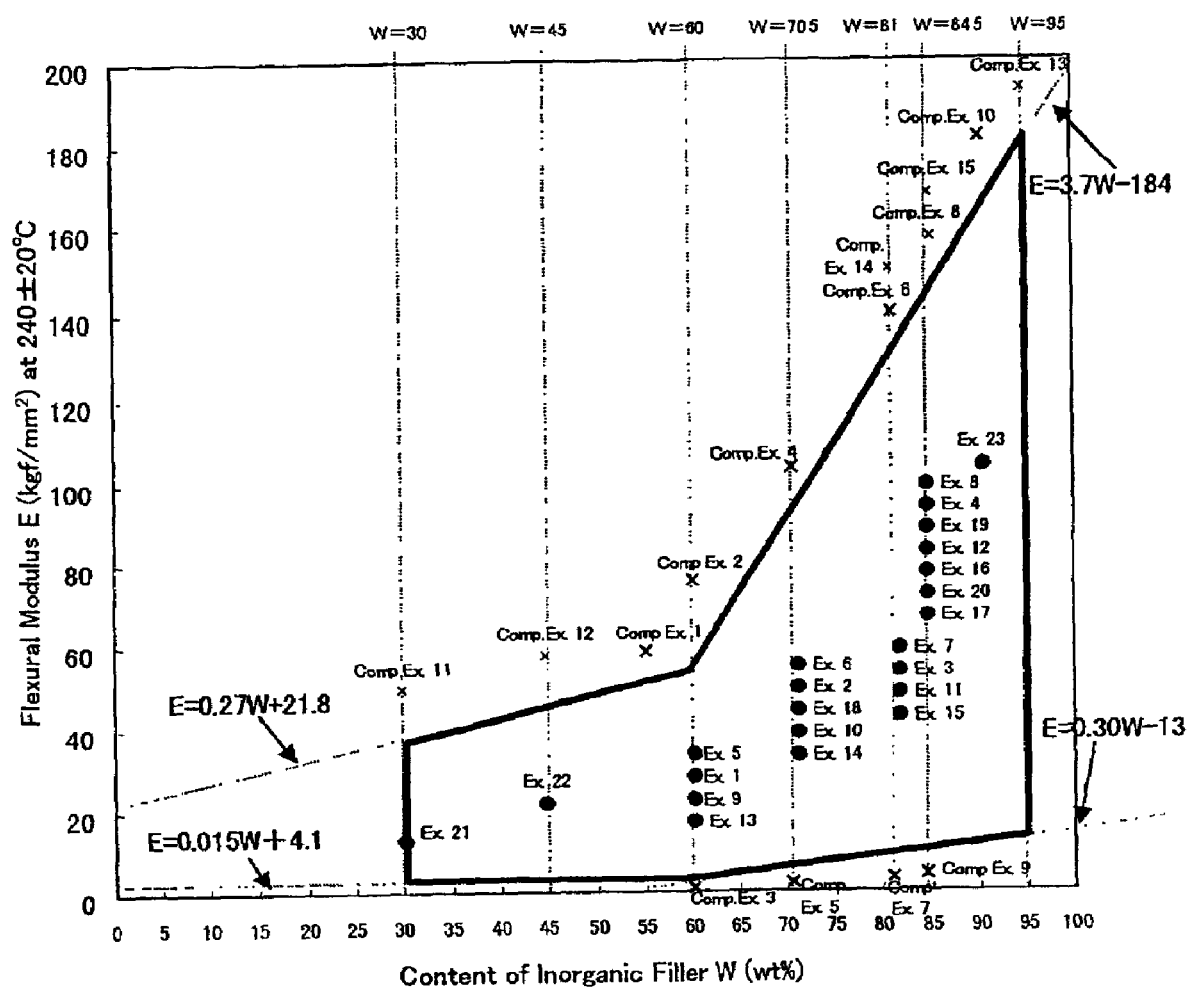
FIG. 1 is a graph showing flexural moduli E at 240±20° C. of epoxy resin compositions in examples and comparative examples.

An epoxy resin composition (1) of the present invention contains the above components (A) to (D) as essential components, and a flexural modulus E (kgf/mm$^2$) at 240±20° C. of a cured article obtained by curing this composition is a value satisfying $0.015\ W+4.1 \leq E \leq 0.27\ W+21.8$ in the case of $30 \leq W<60$, or a value satisfying $0.30\ W-13 \leq E \leq 3.7\ W-184$ in the case of $60 \leq W \leq 95$ wherein W (wt %) is a content of the inorganic filler (C) in the cured article.

On the contrary, if the flexural modulus E is a value satisfying $E<0.015\ W+4.1$ in the case of $30 \leq W \leq 60$ or a value satisfying $E<0.30\ W-13$ in the case of $60 \leq W \leq 95$, a foamed layer is too soft and easily breaks, so that the formation of the foamed layer cannot effectively be performed and hence a sufficient flame retardancy can scarcely be achieved. Conversely, if the flexural modulus E is a value satisfying $E>0.27\ W+21.8$ in the case of $30 \leq W \leq 60$ or a value satisfying $E>3.7\ W-184$ in the case of $60 \leq W \leq 95$, the layer of the foamed layer is too hard, so that the formation of the foamed layer is not effectively performed and hence similarly the sufficient flame retardancy can scarcely be achieved.

The more preferable value of the flexural modulus E is a value satisfying $0.015\ W+7.1 \leq E \leq 0.27\ W+6.8$ in the case of $30 \leq W<60$, or a value satisfying $0.30\ W-10 \leq E \leq 3.7\ W-199$ in the case of $60 \leq W \leq 95$.

In the epoxy resin composition (1) of the present invention, the content W (wt %) of the inorganic filler (C) in its cured article is preferably within the range of $30 \leq W \leq 95$. If the above content W is within the range of W<30, the foamed layer is too soft and easily breaks, so that the formation of the foamed layer is not effectively performed and hence the sufficient flame retardancy can scarcely be achieved. Conversely, if the above content W is within the range of W>95, the layer of the cured article is too hard, so that the formation of the foamed layer is not effectively performed and hence similarly the sufficient flame retardancy can scarcely be achieved. The more preferable value of the content W of the inorganic filler (C) is within the range of $30 \leq W<87$. If $W \geq 87$, the moldability of the epoxy resin composition deteriorates inconveniently in few case.

An epoxy resin composition (2) of the present invention contains the above components (A) to (D) as essential components, and a content of the inorganic filler (C) in a cured article obtained by curing the composition is represented by W (wt %), and values of $Q_1$ and $Q_2$ represented by the following equations satisfy $Q_1 \geq 5$ and $5 \leq Q_2 \leq 50$, respectively, $$Q_1\ (\text{wt \%}) = (q_1/q_3) \times 100$$

$$Q_2\ (\text{wt \%}) = \{(100-q_1-q_2)/q_3\} \times 100$$

wherein $q_1$ (wt %) is a weight ratio, to the cured article, of carbon monoxide and carbon dioxide generated by placing a heat-resistant container including the weighed cured article in a tubular furnace purged with an inert gas at a constant flow rate to bring the atmosphere in the furnace into an inert state, and then thermally decomposing the cured article at 700±10° C. for 10 minutes; $q_2$ (wt %) is a weight ratio, to the cured article, of a residue at the completion of the thermal decomposition, i.e., the inorganic filler and remains carbonized which are not thermally decomposed among the resin components [components other than the inorganic filler (C)] in the cured article; and $q_3$ (wt %) is a weight ratio of the resin components contained in the cured article to the cured article.

Here, the above value $Q_1$ corresponds to a weight ratio of carbon monoxide and carbon dioxide generated from the resin components, i.e., non-organic components (flame retardant components) in the decomposition gas to the resin components, and the above value $Q_2$ corresponds to a weight ratio of gas components other than carbon monoxide and carbon dioxide generated from the resin components, i.e., organic components (combustible components) in the decomposition gas to the resin components. Moreover, the above resin components mean an epoxy resin, a phenolic resin (a curing agent) and additives (a mold release agent, a coupling agent, carbon black and the like) which are organic components.

On the contrary, if the above values $Q_1$ and $Q_2$ are within the ranges of $Q_1<5$ and $Q_2<5$, respectively, the foaming of the resin layer of the cured article is insufficient, so that the foamed layer is not formed enough to make the cured article flame retardant, and hence the flame retardancy is poor. If the above value $Q_2$ is within the range of $Q_2>50$, the combustible components are present in a high ratio in the decomposition gas, so that the decomposition gas secondarily ignites and the combustion easily continues. In consequence, even though the foamed layer is formed, the flame retardancy of the cured article of the epoxy resin tends to lower. The preferable values of the above $Q_1$ and $Q_2$ are values satisfying $Q_1 \geqq 10$ and $5 \leqq Q_2 \leqq 45$, respectively.

The epoxy resin composition (3) of the present invention includes the constitutional requirements and the functions and effects of both the above epoxy resin compositions (1) and (2) of the present invention. In this case, in the epoxy resin composition (3) of the present invention, the above values E, W, $Q_1$ and $Q_2$ are the same as in the epoxy resin compositions (1) and (2) of the present invention.

In the epoxy resin compositions (1) to (4) of the present invention, it is preferred that the aromatic moiety and/or the polyaromatic moiety is included in the crosslinked structure of the cured article of each epoxy resin composition, whereby the flame retardancy, the heat resistance and the humidity resistance of the cured article can be improved.

Furthermore, the above aromatic moiety and/or polyaromatic moiety is particularly preferably one or more selected from the group consisting of phenyl derivatives and biphenyl derivatives, whereby the flame retardancy, the heat resistance and the humidity resistance of the cured article can be further improved.

In the epoxy resin composition of the present invention, the following epoxy resin (A), phenolic resin (B), inorganic filler (C) and curing accelerator (D) can be used, but they are not restrictive.

In view of a fact that the aromatic moiety and/or the polyaromatic moiety, preferably one or more of phenyl derivatives and biphenyl derivatives are introduced into the crosslinked structure of the cured article of the epoxy resin, examples of the suitably usable epoxy resin (A) include epoxy resins containing the aromatic moiety and/or the polyaromatic moiety in the molecule, preferably an epoxy resin including a phenyl derivative having no epoxy group, an epoxy resin including a biphenyl derivative, and an epoxy resin including one or more aromatic moieties, to which 3 to 4 epoxy groups are bonded. In this case, an example of the epoxy resin including the phenyl derivative having no epoxy group is phenolphenylaralkyl epoxy resin represented by the undermentioned formula (1); examples of the epoxy resin including the biphenyl derivative are phenolbiphenylaralkyl epoxy resin represented by the undermentioned formula (2) and a combination of biphenyl-4,4'-diglycidyl ether epoxy resin and 3,3',5,5'-tetramethylbiphenyl-4,4'-diglycidyl ether epoxy resin represented by the undermentioned formula (4); and an example of the epoxy resin including the aromatic moiety to which 3 to 4 epoxy groups are bonded is tetraphenylolethane type epoxy resin represented by the undermentioned formula (3). In addition, among the epoxy resins including the polyaromatic moiety in the molecule, naphtholaralkyl type epoxy resins including a naphthalene derivative may also be used. Furthermore, among epoxy resins including the aromatic moiety in the molecule, bisphenol A type epoxy resin represented by the undermentioned formula (8), bisphenol F type epoxy resin, bisphenol S type epoxy resin and homologues thereof may also be used. The epoxy resins (A) may be used singly or in the form of a mixture of two or more thereof.

In view of a fact that the aromatic moiety and/or the polyaromatic moiety, preferably one or more of phenyl derivatives and biphenyl derivatives are introduced into the crosslinked structure of the cured article of the epoxy resin, examples of the particularly suitably usable phenolic resin (B) include phenolic resins containing the aromatic moiety and/or the polyaromatic moiety in the molecule, preferably phenolic resins including one or more phenyl derivatives having no hydroxyl group, and phenolic resins including one or more biphenyl derivatives having no hydroxyl group. In this case, an example of the phenolic resins including the phenyl derivative having no hydroxyl group is phenolbiphenylaralkyl resin represented by the undermentioned formula (9); examples of phenolic resins including biphenyl derivatives having no hydroxyl group include phenolbiphenylaralkyl resins represented by the undermentioned formulae (10) and (13). In addition, among phenolic resins including the polyaromatic moiety in the molecule, naphtholaralkyl type resins including naphthalene derivatives may also be used. The phenolic resins (B) may be used singly or in the form of a mixture of two or more thereof. Above all, the phenolbiphenylaralkyl resins are preferable from the viewpoint of the flame retardancy.

In this case, it is preferred from the viewpoint of the improvement of the flame retardancy that the above epoxy resin containing the aromatic moiety and/or the polyaromatic moiety in the molecule is included in a ratio of 30 to 100 wt % in the total epoxy resin. Similarly, it is preferred from the viewpoint of the improvement of the flame retardancy that the above phenolic resin containing the aromatic moiety and/or the polyaromatic moiety in the molecule is included in a ratio of 30 to 100 wt % in the total phenolic resin.

Furthermore, when a ratio (OH/Ep) of a phenolic hydroxyl group number (OH) of the total phenolic resin to an epoxy group number (Ep) of the total epoxy resin is $1.0 \leqq (OH/Ep) \leqq 2.5$, the flame retardancy of the cured article obtained by curing them can be improved. Therefore, it is preferred that the ratio (OH/Ep) is within the above range. If the ratio (OH/Ep) is less than 1.0, there increases a generation amount of combustible components such as allyl alcohol derived from the epoxy group which remains in a crosslinked structure formed by the epoxy resin and the phenolic resin in the cured article during the thermal decomposition or at the ignition of the cured article, so that the improvement of the flame retardancy is liable to be impaired. Conversely, if the ratio (OH/Ep) is more than 2.5, a crosslinking density of the cured article obtained by curing the above epoxy resin composition excessively lowers, so that the curing of this resin composition is insufficient and hence the heat resistance and strength of the above cured article are poor sometimes.

As the inorganic filler (C), there can widely be used fillers which have usually been utilized for the semiconductor encapsulating resin, and examples of the inorganic fillers include fused silica powder, crystalline silica powder, alumina powder, silicon nitride and glass fiber. The inorganic fillers (C) may be used singly or in the form of a mixture of two or more thereof.

As the curing accelerator (D), there can widely be used curing accelerators which are usually utilized for the semiconductor encapsulating resin and which can accelerate the curing reaction between the epoxy group and the phenolic hydroxyl group, and examples of the curing accelerators include triphenylphosphine, 2-methylimidazole and 1,8-diazabicyclo[5.4.0]undecene-7. The curing accelerators (D) may be used singly or in the form of a mixture of two or more thereof.

Furthermore, to the epoxy resin composition of the present invention, if necessary, various kinds of additives may be suitably added in addition to the above components (A) to (D), and examples of the additives include a colorant such as carbon black, a silane coupling agent such as (γ-glycidoxypropyl)trimethoxysilane, a low-stress component such as silicone oil or silicone rubber, and a mold release agent such as a natural wax, a synthetic wax, a higher fatty acid and its metallic salt, or a paraffin.

The epoxy resin composition of the present invention can be prepared by preliminarily kneading constitutional materials by a ribbon blender, a Henschel mixer or the like, and then mixing them by the use of a heating roller or a kneader. If necessary, an organic solvent and water are volatilized, and the epoxy resin composition is then heated under predetermined conditions by a transfer molding machine or a heating press molding machine to carry out a crosslinking reaction and curing, thereby obtaining a molded article of the cured epoxy resin having the high flame retardancy.

A semiconductor device of the present invention can be prepared by encapsulating an electronic part such as a semiconductor with the epoxy resin composition of the present invention. In this case, examples of the semiconductor device of the present invention include a semiconductor device prepared by mounting a semiconductor element on a die pad of a lead frame, bonding a wire thereto, and then encapsulating it with the resin, a resin encapsulating type semiconductor device of a lead on-chip system, and a resin encapsulating type semiconductor device of ball grid array, but they are not restrictive. The semiconductor device of the present invention covers all of electronic parts such as semiconductors encapsulated with the epoxy resin composition of the present invention.

EXAMPLES

Next, the present invention will be described in more detail in accordance with examples, but the scope of the present invention should not be limited to these examples. In the following examples and comparative examples, "%" means "wt %".

Abbreviations and structures of epoxy resins and phenolic resins which were used in the examples and the comparative examples will be mentioned all together as follows:

Epoxy resin 1: Phenolphenylaralkyl epoxy resin represented by the undermentioned formula (1)
(n=0–10, softening point=55° C., epoxy equivalent=238 g/eq)

Epoxy resin 2: Phenolbiphenylaralkyl epoxy resin represented by the undermentioned formula (2)
(n=0–10, softening point=57° C., epoxy equivalent=274 g/eq)

Epoxy resin 3: Epoxy resin composition mainly comprising tetraphenylolethane type epoxy resin represented by the undermentioned formula (3)
(softening point=92° C., epoxy equivalent=203 g/eq)

Epoxy resin 4: Epoxy resin composition mainly comprising a combination of biphenyl-4,4'-diglycidyl ether epoxy resin and 3,3',5,5'-tetramethylbiphenyl-4,4'-diglycidyl ether epoxy resin represented by the undermentioned formula (4)
(melting point=111° C., epoxy equivalent=170 g/eq)

Epoxy resin 5: Cresol novolac epoxy resin represented by the undermentioned formula (5)
(n=0–10, softening point=68° C., epoxy equivalent=194 g/eq)

Epoxy resin 6: Dicyclopentadiene type epoxy resin represented by the undermentioned formula (6)
(n=0–10, softening point=56° C., epoxy equivalent=241 g/eq)

Epoxy resin 7: Combination of bisphenol A type epoxy resin and brominated bisphenol A type epoxy resin represented by the undermentioned formula (7)
(n=0–10, softening point=70° C., epoxy equivalent=357 g/eq, bromine content=bromine/epoxy resin=20 wt %)

Epoxy resin 8: Bisphenol A type epoxy resin represented by the undermentioned formula (8)
(n=0–0.8, viscosity at 25° C.=6500 cps, epoxy equivalent=176 g/eq)

Phenolic resin 1: Phenolphenylaralkyl resin represented by the undermentioned formula (9)
(n=0–10, softening point=83° C., hydroxyl group equivalent=175 g/eq)

Phenolic resin 2: Phenolbiphenylaralkyl resin represented by the undermentioned formula (10)
(n=0–10, softening point=120° C., hydroxyl group equivalent=208 g/eq)

Phenolic resin 3: Phenol novolac resin represented by the undermentioned formula (11)
(n=0–10, softening point=106° C., hydroxyl group equivalent=106 g/eq)

Phenolic resin 4: Dicyclopentadiene type phenolic resin represented by the undermentioned formula (12)
(n=0–10, softening point=92° C., hydroxyl group equivalent=170 g/eq)

Phenolic resin 5: Phenolbiphenylaralkyl resin represented by the undermentioned formula (13)
(n=0–2, softening point=100° C., hydroxyl group equivalent=196 g/eq)

Amine-based curing agent 1: Diaminodiphenylmethane represented by the undermentioned formula (14)
(softening point=89° C., active hydrogen equivalent=49.5 g/eq)

formula (1)

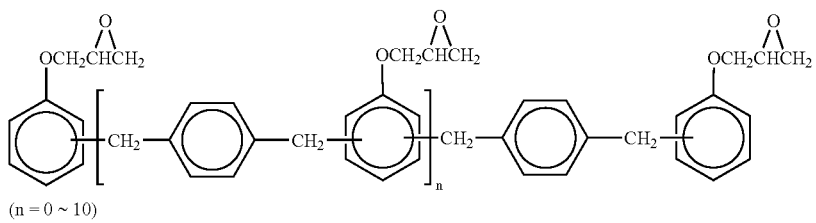

(n = 0 ~ 10)

-continued
formula (2)
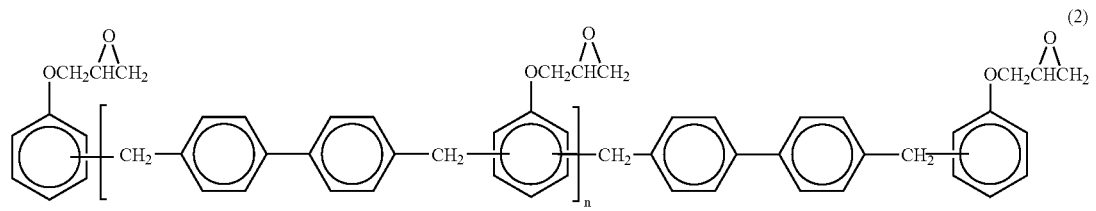
(n = 0 ~ 10)
formula (3)
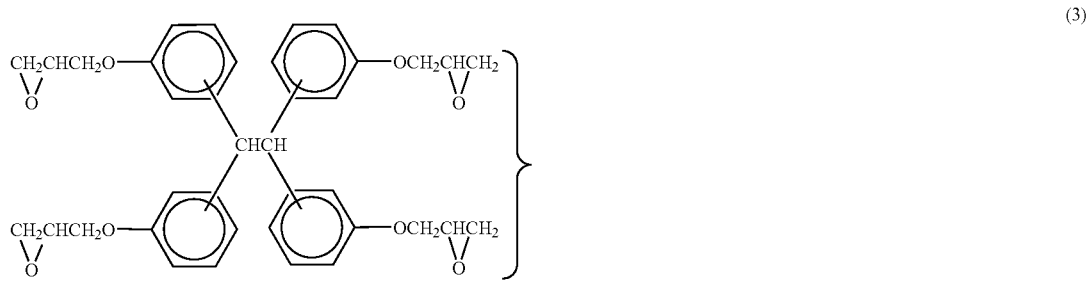
formula (4)
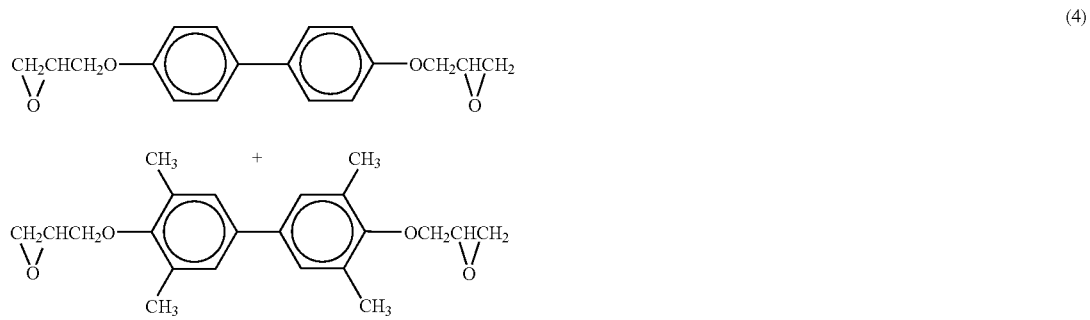
formula (5)
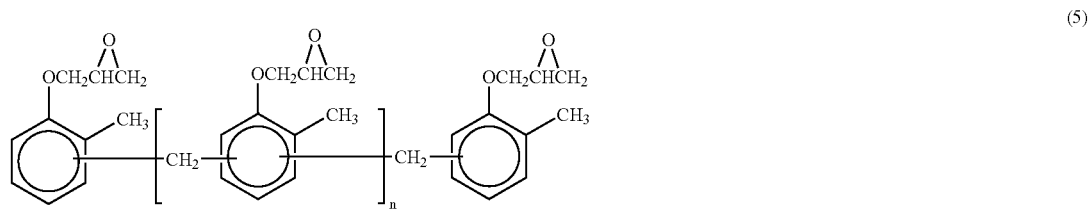
(n = 0 ~ 10)
formula (6)
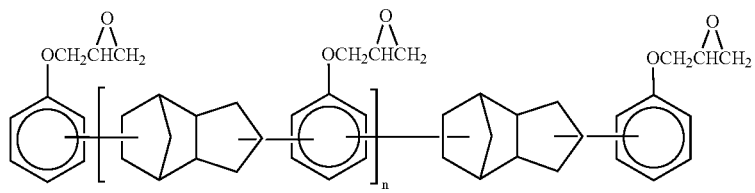
(n = 0 ~ 10)
formula (7)

-continued
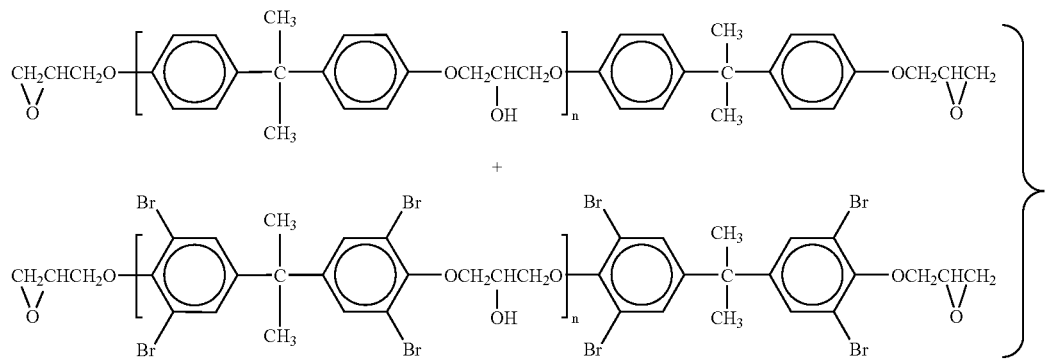
(n = 0 ~ 10)
formula (8)
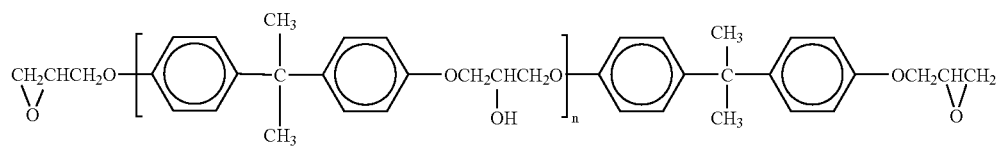
(n = 0 ~ 0.8)
formula (9)
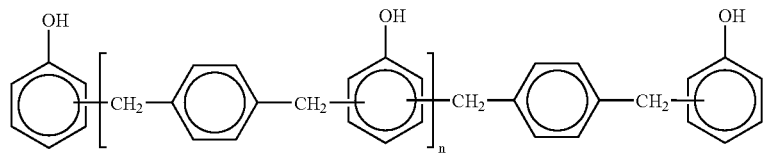
(n = 0 ~ 10)
formula (10)
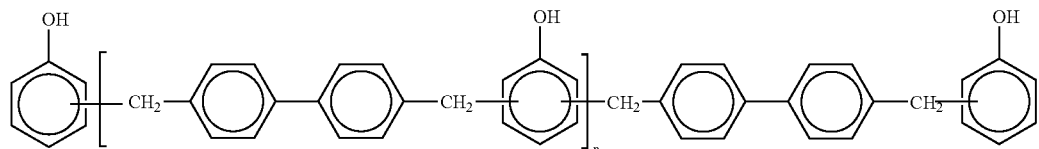
(n = 0 ~ 10)
formula (11)
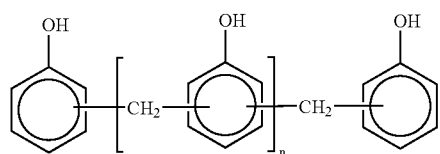
(n = 0 ~ 10)
formula (12)
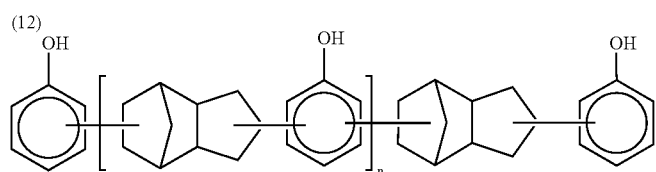
(n = 0 ~ 10)
formula (13)

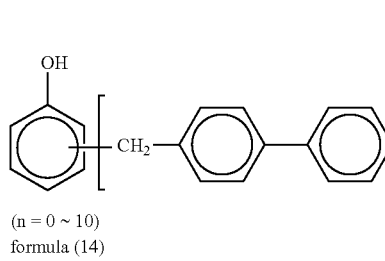

(n = 0 ~ 10)
formula (14)

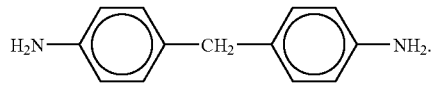

[0044]

Fused flake silica used in Examples 1, 2, 5, 6, 9, 10, 13, 14, 18, 21 and 22 as well as Comparative Examples 1 to 5, 11 and 12 had an average particle diameter of 15 μm and a specific surface area of 2.2 $m^2$/g. In addition, fused spherical silica used in Examples 3, 4, 7, 8, 11, 12, 15, 16, 17, 19, 20 and 23 as well as Comparative Examples 6 to 10 and 13 to 15 had an average particle diameter of 22 μm and a specific surface area of 5.0 $m^2$/g.

Example 1

16.58% of Epoxy resin 4, 20.23% of Phenolic resin 2, 60.0% of fused flake silica powder, 0.51% of carnauba wax, 0.40% of triphenylphosphine (T.P.P.), 1.57% of a silane coupling agent and 0.71% of carbon black were preliminarily mixed at ordinary temperature, and then kneaded for 5 minutes on a roll at 100° C. The thus kneaded material was cooled and then ground to obtain a resin composition.

The resin composition obtained in Example 1 was tableted, and then molded under predetermined conditions [a single plunger type transfer molding machine, molding temperature=175° C., tablet preheating=85° C., molding time=120 seconds, injection time=15 seconds, and injection pressure 100 kgf/$cm^2$ (practical pressure)]. Afterward, the thus molded article was postcured (175° C., 4 hours) to obtain a cured article.

A molded plate for the measurement of flexural modulus was prepared in accordance with JIS K6911, and a molded plate for the test of flame retardancy was prepared in accordance with flame retardant standards of UL94 by the use of the above cured articles, respectively. For the above molded plates, the measurement of the flexural modulus and the test of the flame retardancy were carried out. The molded plate which had undergone the test of the flame retardancy was cut and worked, and its section was then observed by a reflective fluorescent microscope. In addition, the above cured article was subjected to a gas analysis (measurement of $Q_1$ and $Q_2$).

Solder crack resistance was evaluated as follows. A silicon chip of 7.5 mm×7.5 mm×350 μm was encapsulated with tablets of the resin composition of Example 1 described above under predetermined conditions [a single plunger type transfer molding machine, molding temperature=175° C., tablet preheating=85° C., molding time=120 seconds, injection time=15 seconds, and injection pressure=100 kgf/$cm^2$ (practical pressure)] to obtain a 80-pin QFP type (14×20×2.7 mm) semiconductor device, and the composition was then postcured (175° C., 4 hours). The thus treated semiconductor device was used to evaluate the solder crack resistance.

Humidity resistance and wire corrosion resistance were evaluated as follows. A silicon chip of 3.0 mm×3.5 mm×350 μm to which aluminum wires (each pad portion was a square having one side of 70 μm) having a wire width of 10 μm were bonded at a wire space of 10 μm was mounted on a frame of 42 alloy for 16-pin DIP (an alloy comprising 42% of nickel, about 1% of cobalt-chromium, and the balance of iron), and Au wire having a diameter of 28 μm was bonded to the pad portion. The thus wire-bonded chip was encapsulated with tablets of the resin composition of Example 1 described above under predetermined conditions [a single plunger type transfer molding machine, molding temperature=175° C., tablet preheating=85° C., molding time=120 seconds, injection time=15 seconds, and injection pressure=100 kgf/$cm^2$ (practical pressure)] to obtain a 16-pin DIP type (18×5×3 mm) semiconductor device, and the composition was then postcured (175° C., 4 hours). The thus treated semiconductor device was used to evaluate the humidity resistance and the wire corrosion resistance.

Example 21

32.07% of Epoxy resin 8, 35.59% of Phenolic resin 5, 30.0% of fused flake silica powder, 0.34% of 1,8-diazabicyclo[5.4.0]undecene-7 (D.B.U) and 2.0% of a silane coupling agent were heated and molten while mixed by a batch type stirring machine, and then defoamed under vacuum to obtain a resin composition. The thus obtained resin composition was poured into a mold in the state of reduced pressure, and then cured under predetermined conditions (80° C.×2 hours+120° C.×2 hours+200° C.×5 hours) to obtain a cured article.

Comparative Example 11

53.09% of Epoxy resin 8, 14.91% of Amine-based curing agent 1, 30.0% of fused flake silica powder and 2.0% of a silane coupling agent were heated and molten while mixed by a batch type stirring machine, and then defoamed under vacuum to obtain a resin composition. The thus obtained resin composition was poured into a mold in the state of reduced pressure, and then cured under predetermined conditions (80° C.×2 hours+120° C.×2 hours+200° C.×5 hours) to obtain a cured article.

A molded plate for the measurement of flexural modulus was prepared in accordance with JIS K6911, and a molded plate for the test of flame retardancy was prepared in accordance with flame retardant standards of UL94 by the use of the above cured articles of Example 21 and Comparative Example 11, respectively. For the above molded plates, the measurement of the flexural modulus and the test of the flame retardancy were carried out. The molded plate which had undergone the test of the flame retardancy was cut and worked, and its section was then observed by a reflective fluorescent microscope. In addition, the above cured articles were subjected to a gas analysis (measurement of $Q_1$ and $Q_2$).

Next, items for the respective tests and evaluation standards thereof will be described together.

Measurement of the Flexural Modulus:

The measurement test of the flexural modulus E (kgf/mm$^2$) at 240° C. was carried out in accordance with JIS K6911. The evaluation standards are as follows.

Symbol o . . . The value of E is within the above range=Self-extinguishing mechanism can be manifested Symbol × . . . The value of E is outside the above range=Combustion continues Test of the Flame Retardancy:

The flame retardancy was evaluated by carrying out a UL-94 vertical test. The procedure of this test was as follows. The molded plate (length 127 mm×width 12.7 mm×thickness 1.6 mm) was fixed by a sample cramp so that the lengthwise direction of the molded plate might be vertical to the surface of the ground. Next, an edge of the molded plate opposite to a cramped edge thereof was brought into contact with a flame of a burner for 10 seconds, and the burner was then separated therefrom, and a time (a remaining flame time, seconds) during which the flame remained on the molded plate was measured (the remaining flame time at the first time=F1). When this flame went out, the molded plate was brought into contact with the flame of the burner for 10 seconds again, and the burner was then separated therefrom, and in the same manner as in the first time, a remaining flame time was measured (the remaining flame time at the second time=F2). For one kind of cured epoxy resin, five molded plates were tested to evaluate the flame retardancy. In this case, the evaluation of the flame retardancy was made in accordance with the order of the highest to the lowest, i.e., the order of UL94V-O, V-1, V-2 and NOTV-2.

(UL94V-0)

$\Sigma F \leq 50$ seconds ($\Sigma F$=Total of the remaining flame times in the tests made by using five molded plates)

$F_{max} \leq 10$ seconds ($F_{max}$=The longest remaining flame time of F1 and F2 obtained by the tests)

Drip (a phenomenon that the cured article drips by contact with the flame) does not occur, and the molded plate does not burn to the cramp.

(UL94V-1)

$\Sigma F \leq 250$ seconds, $F_{max} \leq 30$ seconds, any drip does not occur, and the molded plate does not burn to the cramp.

(UL94V-2)

$\Sigma F \leq 250$ seconds, $F_{max} \leq 30$ seconds, the drip occurs, and the molded plate does not burn to the cramp.

(UL94NOTV-2)

$\Sigma F > 250$ seconds, $F_{max} > 30$ seconds, and the molded plate burns out to the cramp.

Observation of the Section of the Molded Plate after the Combustion by a Reflective Fluorescent Microscope:

Symbol o . . . The formation of a foamed layer is observed.

Symbol ×1 . . . The formation of the foamed layer is not observed, and some cracks occur.

Symbol ×2 . . . The formation of the foamed layer is not observed, and the cured article is molten.

Evaluation Test of Solder Crack Resistance:

Ten of encapsulated 80-pin QFP type semiconductor devices for the test were exposed to high-temperature high-humidity conditions, i.e., 85° C. and 85RH % for a predetermined time (80 hours, 120 hours), and IR reflow was then carried out three times at 240° C. for 10 seconds. At this time, the presence/absence of the generation of the cracks (internal cracks and external cracks) was observed by an scanning acoustic tomography device. On the basis of the obtained results, the number of packages in which the cracks occurred was counted, and this number was used as an index of the solder crack resistance. That is to say, it is apparent that the smaller this number is, the more excellent the solder crack resistance is.

Evaluation Test of Humidity Resistance:

Ten of encapsulated 16-pin DIP type semiconductor devices for the test were subjected to a pressure cooker bias test (PCBT) at 125° C. and 100 RH % under an applied voltage of 20 V for a predetermined time (100 hours, 200 hours), and a failure ratio was calculated from the number of the devices in which an open failure of a circuit occurred and it was utilized as an index of the humidity resistance. That is to say, it is apparent that the smaller this failure ratio is, the more excellent the humidity resistance is.

Evaluation Test of Wire Corrosion Resistance:

Ten of encapsulated 16 pin DIP type semiconductor devices for the test were subjected to a treatment for a predetermined time (500 hours, 720 hours) in a thermostatic chamber at 185° C., and a resistance between pins symmetrically arranged across a chip of each device was then measured (at 8 points in total) to calculate an average value. The device in which a difference between this average value and a resistance (blank) of an untreated device was 20% or more based on the resistance of the blank was regarded as a defective. Here, a failure ratio was calculated from the number of the devices regarded as the defectives, and it was utilized as an index of the high temperature storage resistance. That is to say, it is apparent that the lower this failure ratio is, the more excellent the wire corrosion resistance is.

Gas Analysis (Measurement of $Q_1$ and $Q_2$):

A magnetic boat including a weighed cured article (here 0.1 g) in which the content of an inorganic filler was W (wt %) was placed in a tubular furnace (made by Lindoberg Co., Ltd.), and the cured article was then thermally decomposed under conditions of thermal decomposition temperature=700±10° C., thermal decomposition time=10 minutes, atmospheric gas=nitrogen ($N_2$) and atmospheric gas feed rate=0.5 L/min. At this time, a generated gas component was collected in a gas bag, and a weight ratio $q_1$ (wt %) of generated carbon monoxide and carbon dioxide to a unit weight of the cured article was measured by a gas chromatography/thermal conductivity detector (GC/TCD). In addition, a ratio of a residue to the cured article at the time of the completion of the thermal decomposition, i.e., a weight ratio $q_2$ (wt %) of undecomposed and left carbides and the inorganic filler among resin components (e.g., an epoxy resin, a phenolic resin, carnauba wax, T.P.P., a silane coupling agent and carbon black) to the cured article was measured. When a weight ratio of the components (the above-mentioned resin components) other than an inorganic filler (C) contained in the cured article was represented by $q_3$ (wt %), the values of $Q_1$ and $Q_2$ were calculated in accordance with the equations $Q_1$ (wt %)=$(q_1/q_3) \times 100$ $Q_2$ (wt %)=$\{(100-q_1-q_2)/q_3\} \times 100$.

Examples 2 to 20 and 23, Comparative Examples 1 to 10 and 13 to 15

Samples were prepared in the same manner as in Example 1 in accordance with blend ratios in Tables 1 to 8, and characteristics were then evaluated by the same procedure as in Example 1. The results of the evaluation are shown in Tables 1 to 8 and FIG. 1.

Example 22

Samples were prepared in the same manner as in Example 21 in accordance with blend ratios in Table 5, and characteristics were then evaluated by the same procedure as in Example 21. The results of the evaluation are shown in Table 5 and FIG. 1.

Comparative Example 12

Samples were prepared in the same manner as in Comparative Example 11 in accordance with blend ratios in Table 8, and characteristics were then evaluated by the same procedure as in Comparative Example 11. The results of the evaluation are shown in Table 8 and FIG. 1.

As shown in the above examples, each of the cured articles of the epoxy resin compositions according to the present invention has a flexural modulus at a high temperature ($240\pm20°$ C.) within a predetermined range, and so a foamed layer can be formed during thermal decomposition or at ignition. Accordingly, it is understandable that, in the cured articles regarding the present invention, a higher flame retardancy can be attained than in cured articles of epoxy resin compositions described in the comparative examples in which the flexural modulus at the high temperature is outside the predetermined range. Furthermore, the resin layer can be expanded like a rubber owing to a gas component generated by the decomposition of the resin components during the thermal decomposition or at the ignition to form the foam layer, but if this decomposition gas breaks the foamed layer and comes out to the outside, a combustible component contained in the decomposition gas, i.e., a low-boiling organic component ignites and the combustion continues. Therefore, an amount of the generated organic component has a large influence on the flame retardancy. As described in the examples, the cured articles of the epoxy resin compositions according to the present invention have the values $Q_1$ and $Q_2$ satisfying $Q_1 \geq 5$ and $5 \leq Q_2 \leq 50$, and for this reason, the good flame retardancy can be obtained. On the contrary, the cured articles of the epoxy resin compositions described in the comparative examples have the values $Q_1$ and $Q_2$ outside the above range, so that it is apparent that particularly the flame retardancy is poor. In addition, semiconductor devices in which the epoxy resin compositions having the good flame retardancy are used are excellent in reliability, for example, solder crack resistance, humidity resistance and wire corrosion resistance at a high temperature.

SUMMARY OF DISCLOSURE

The effects of the present invention are to be able to provide an epoxy resin composition having a high flame retardancy and reliability, particularly excellent solder crack resistance and humidity resistance without using any flame retardant material such as a conventional halogen-based or phosphorus-based flame retardant material and without particularly highly filling an inorganic filler, and to be able to provide a semiconductor device in which the above epoxy resin composition is used. Moreover, in the present invention, neither the halogen-based flame retardant material nor diantimony trioxide is used, so that there can be overcome a problem that a halogen or antimony derived from the flame retardant material or a flame retardant auxiliary at a high temperature accelerates the corrosion of wires in the semiconductor device, whereby the reliability of the semiconductor device can be improved.

REFERENCES

1. Japanese Patent Application Laid-Open No. 188638/1996
2. Japanese Patent Application Laid-Open No. 253555/1996
3. Japanese Patent Application Laid-Open No. 301984/1996
4. Japanese Patent Application Laid-Open No. 52999/1997
5. Japanese Patent Application Laid-Open No. 20880811997
6. Japanese Patent Application Laid-Open No. 17636/1998
7. Japanese Patent Application Laid-Open No. 182941/1998

TABLE 1

| | | Ex. 1 | Ex. 2 | Ex. 3 | Ex. 4 |
|---|---|---|---|---|---|
| Epoxy resin 1 (wt %) | | | | | |
| Epoxy resin 2 (wt %) | | | | | |
| Epoxy resin 3 (wt %) | | | | | |
| Epoxy resin 4 (wt %) | | 16.58 | 12.22 | 7.87 | 6.42 |
| Epoxy resin 5 (wt %) | | | | | |
| Epoxy resin 6 (wt %) | | | | | |
| Epoxy resin 7 (wt %) | | | | | |
| Phenolic resin 1 (wt %) | | | | | |
| Phenolic resin 2 (wt %) | | 20.23 | 14.91 | 9.61 | 7.83 |
| Phenolic resin 3 (wt %) | | | | | |
| Phenolic resin 4 (wt %) | | | | | |
| OH/Ep | | 1.0 | 1.0 | 1.0 | 1.0 |
| Fused flake silica (wt %) | | 60.0 | 70.5 | | |
| Fused spherical silica (wt %) | | | | 81.0 | 84.5 |
| Carnauba wax (wt %) | | 0.51 | 0.38 | 0.24 | 0.20 |
| T.P.P. (wt %) | | 0.40 | 0.30 | 0.19 | 0.16 |
| Silane coupling agent (wt %) | | 1.57 | 1.16 | 0.75 | 0.61 |
| Carbon black (wt %) | | 0.71 | 0.53 | 0.34 | 0.28 |
| Flexural modulus at 240° C. (kgf/mm$^2$) | | ○ 28.0 | ○ 54.3 | ○ 72.4 | ○ 84.8 |
| Flame retardancy | | V-0 | V-0 | V-0 | V-0 |
| ΣF (sec) | | 50 | 47 | 40 | 32 |
| Observation of section after combustion | | ○ | ○ | ○ | ○ |
| Solder crack | 80 hr | — | 0 | 0 | 0 |
| resistance (number) | 120 hr | — | 2 | 1 | 0 |
| Humidity resistance | 100 hr | 0 | 0 | 0 | 0 |
| Failure ratio (number) | 200 hr | 4 | 3 | 1 | 0 |
| Wire corrosion resistance | 500 hr | — | 0 | 0 | 0 |
| Failure ratio (number) | 720 hr | — | 3 | 2 | 1 |
| $Q_1$ (wt %) | | 8 | 7 | 8 | 8 |
| $Q_2$ (wt %) | | 45 | 45 | 44 | 45 |

TABLE 2

| | Ex. 5 | Ex. 6 | Ex. 7 | Ex. 8 |
|---|---|---|---|---|
| Epoxy resin 1 (wt %) | | | | |
| Epoxy resin 2 (wt %) | | | | |
| Epoxy resin 3 (wt %) | 18.22 | 13.43 | 8.65 | 7.05 |
| Epoxy resin 4 (wt %) | | | | |
| Epoxy resin 5 (wt %) | | | | |
| Epoxy resin 6 (wt %) | | | | |
| Epoxy resin 7 (wt %) | | | | |
| Phenolic resin 1 (wt %) | | | | |
| Phenolic resin 2 (wt %) | 18.59 | 13.70 | 8.83 | 7.20 |
| Phenolic resin 3 (wt %) | | | | |
| Phenolic resin 4 (wt %) | | | | |
| OH/Ep | 1.0 | 1.0 | 1.0 | 1.0 |
| Fused flake silica (wt %) | 60.0 | 70.5 | | |
| Fused spherical silica (wt %) | | | 81.0 | 84.5 |

TABLE 2-continued

|  |  | Ex. 5 | Ex. 6 | Ex. 7 | Ex. 8 |
|---|---|---|---|---|---|
| Carnauba wax (wt %) |  | 0.51 | 0.38 | 0.24 | 0.20 |
| T.P.P. (wt %) |  | 0.40 | 0.30 | 0.19 | 0.16 |
| Silane coupling agent (wt %) |  | 1.57 | 1.16 | 0.75 | 0.61 |
| Carbon black (wt %) |  | 0.71 | 0.53 | 0.34 | 0.28 |
| Flexural modulus at 240° C. (kgf/mm$^2$) |  | ○ 29.0 | ○ 67.9 | ○ 106.1 | ○ 119.0 |
| Flame retardancy |  | V-0 | V-0 | V-0 | V-0 |
| $\Sigma F$ (sec) |  | 35 | 28 | 20 | 17 |
| Observation of section after combustion |  | ○ | ○ | ○ | ○ |
| Solder crack | 80 hr | — | 0 | 0 | 0 |
| resistance (number) | 120 hr | — | 3 | 1 | 0 |
| Humidity resistance | 100 hr | 0 | 0 | 0 | 0 |
| Failure ratio (number) | 200 hr | 4 | 3 | 2 | 0 |
| Wire corrosion resistance | 500 hr | — | 0 | 0 | 0 |
| Failure ratio (number) | 720 hr | — | 2 | 1 | 0 |
| $Q_1$ (wt %) |  | 9 | 8 | 9 | 9 |
| $Q_2$ (wt %) |  | 43 | 44 | 44 | 43 |

TABLE 3

|  |  | Ex. 9 | Ex. 10 | Ex. 11 | Ex. 12 |
|---|---|---|---|---|---|
| Epoxy resin 1 (wt %) |  | 21.16 | 15.59 | 10.05 | 8.19 |
| Epoxy resin 2 (wt %) |  |  |  |  |  |
| Epoxy resin 3 (wt %) |  |  |  |  |  |
| Epoxy resin 4 (wt %) |  |  |  |  |  |
| Epoxy resin 5 (wt %) |  |  |  |  |  |
| Epoxy resin 6 (wt %) |  |  |  |  |  |
| Epoxy resin 7 (wt %) |  |  |  |  |  |
| Phenolic resin 1 (wt %) |  | 15.65 | 11.54 | 7.43 | 6.06 |
| Phenolic resin 2 (wt %) |  |  |  |  |  |
| Phenolic resin 3 (wt %) |  |  |  |  |  |
| Phenolic resin 4 (wt %) |  |  |  |  |  |
| OH/Ep |  | 1.0 | 1.0 | 1.0 | 1.0 |
| Fused flake silica (wt %) |  | 60.0 | 70.5 |  |  |
| Fused spherical silica (wt %) |  |  |  | 81.0 | 84.5 |
| Carnauba wax (wt %) |  | 0.51 | 0.38 | 0.24 | 0.20 |
| T.P.P. (wt %) |  | 0.40 | 0.30 | 0.19 | 0.16 |
| Silane coupling agent (wt %) |  | 1.57 | 1.16 | 0.75 | 0.61 |
| Carbon black (wt %) |  | 0.71 | 0.53 | 0.34 | 0.28 |
| Flexural modulus at 240° C. (kgf/mm$^2$) |  | ○ 16.7 | ○ 31.4 | ○ 49.1 | ○ 62.0 |
| Flame retardancy |  | V-0 | V-0 | V-0 | V-0 |
| $\Sigma F$ (sec) |  | 21 | 18 | 14 | 10 |
| Observation of section after combustion |  | ○ | ○ | ○ | ○ |
| Solder crack | 80 hr | — | 0 | 0 | 0 |
| resistance (number) | 120 hr | — | 2 | 1 | 1 |
| Humidity resistance | 100 hr | 0 | 0 | 0 | 0 |
| Failure ratio (number) | 200 hr | 4 | 3 | 1 | 0 |
| Wire corrosion resistance | 500 hr | — | 0 | 0 | 0 |
| Failure ratio (number) | 720 hr | — | 2 | 1 | 0 |
| $Q_1$ (wt %) |  | 10 | 11 | 10 | 11 |
| $Q_2$ (wt %) |  | 38 | 37 | 37 | 39 |

TABLE 4

|  |  | Ex. 13 | Ex. 14 | Ex. 15 | Ex. 16 | Ex. 17 |
|---|---|---|---|---|---|---|
| Epoxy resin 1 (wt %) |  |  |  |  |  |  |
| Epoxy resin 2 (wt %) |  | 20.91 | 15.41 | 9.93 | 8.10 | 6.66 |
| Epoxy resin 3 (wt %) |  |  |  |  |  |  |
| Epoxy resin 4 (wt %) |  |  |  |  |  |  |
| Epoxy resin 5 (wt %) |  |  |  |  |  |  |
| Epoxy resin 6 (wt %) |  |  |  |  |  |  |
| Epoxy resin 7 (wt %) |  |  |  |  |  |  |
| Phenolic resin 1 (wt %) |  |  |  |  |  |  |
| Phenolic resin 2 (wt %) |  | 15.90 | 11.72 | 7.55 | 6.15 | 7.59 |
| Phenolic resin 3 (wt %) |  |  |  |  |  |  |
| Phenolic resin 4 (wt %) |  |  |  |  |  |  |

TABLE 4-continued

|  |  | Ex. 13 | Ex. 14 | Ex. 15 | Ex. 16 | Ex. 17 |
|---|---|---|---|---|---|---|
| OH/Ep |  | 1.0 | 1.0 | 1.0 | 1.0 | 1.5 |
| Fused flake silica (wt %) |  | 60.0 | 70.5 |  |  |  |
| Fused spherical silica (wt %) |  |  |  | 81.0 | 84.5 | 84.5 |
| Carnauba wax (wt %) |  | 0.51 | 0.38 | 0.24 | 0.20 | 0.20 |
| T.P.P. (wt %) |  | 0.40 | 0.30 | 0.19 | 0.16 | 0.16 |
| Silane coupling agent (wt %) |  | 1.57 | 1.16 | 0.75 | 0.61 | 0.61 |
| Carbon black (wt %) |  | 0.71 | 0.53 | 0.34 | 0.28 | 0.28 |
| Flexural modulus at 240° C. (kgf/mm$^2$) |  | ○ 14.0 | ○ 28.2 | ○ 46.8 | ○ 59.7 | ○ 39.8 |
| Flame retardancy |  | V-0 | V-0 | V-0 | V-0 | V-0 |
| $\Sigma F$ (sec) |  | 14 | 11 | 7 | 5 | 2 |
| Observation of section after combustion |  | ○ | ○ | ○ | ○ | ○ |
| Solder crack | 80 hr | — | 0 | 0 | 0 | 0 |
| resistance (number) | 120 hr | — | 2 | 0 | 0 | 1 |
| Humidity resistance | 100 hr | 0 | 0 | 0 | 0 | 0 |
| Failure ratio (number) | 200 hr | 3 | 2 | 1 | 0 | 1 |
| Wire corrosion resistance | 500 hr | — | 0 | 0 | 0 | 0 |
| Failure ratio (number) | 720 hr | — | 1 | 0 | 0 | 1 |
| $Q_1$ (wt %) |  | 11 | 12 | 11 | 11 | 8 |
| $Q_2$ (wt %) |  | 40 | 39 | 41 | 40 | 41 |

TABLE 5

|  |  | Ex. 18 | Ex. 19 | Ex. 20 |
|---|---|---|---|---|
| Epoxy resin 1 (wt %) |  |  |  |  |
| Epoxy resin 2 (wt %) |  | 12.54 | 6.60 | 5.4 |
| Epoxy resin 3 (wt %) |  | 2.51 | 1.32 | 1.08 |
| Epoxy resin 4 (wt %) |  |  |  |  |
| Epoxy resin 5 (wt %) |  |  |  |  |
| Epoxy resin 6 (wt %) |  |  |  |  |
| Epoxy resin 7 (wt %) |  |  |  |  |
| Epoxy resin 8 (wt %) |  |  |  |  |
| Phenolic resin 2 (wt %) |  | 12.08 | 6.33 | 7.77 |
| Phenolic resin 3 (wt %) |  |  |  |  |
| Phenolic resin 4 (wt %) |  |  |  |  |
| Phenolic resin 5 (wt %) |  |  |  |  |
| Amine based curing agent 1 (wt %) |  |  |  |  |
| OH/Ep |  | 1.0 | 1.0 | 1.5 |
| Fused flake silica (wt %) |  | 70.5 |  |  |
| Fused spherical silica (wt %) |  |  | 84.5 | 84.5 |
| Carnauba wax (wt %) |  | 0.38 | 0.20 | 0.20 |
| T.P.P. (wt %) |  | 0.30 | 0.16 | 0.16 |
| D.B.U. (wt %) |  |  |  |  |
| Silane coupling agent (wt %) |  | 1.16 | 0.61 | 0.61 |
| Carbon black (wt %) |  | 0.53 | 0.28 | 0.28 |
| Flexural modulus at 240° C. (kgf/mm$^2$) |  | ○ 42.3 | ○ 77.1 | ○ 55.5 |
| Flame retardancy |  | V-0 | V-0 | V-0 |
| $\Sigma F$ (sec) |  | 15 | 9 | 7 |
| Observation of section after combustion |  | ○ | ○ | ○ |
| Solder crack | 80 hr | 0 | 0 | 0 |
| resistance (number) | 120 hr | 2 | 1 | 2 |
| Humidity resistance | 100 hr | 0 | 0 | 0 |
| Failure ratio (number) | 200 hr | 3 | 0 | 2 |
| Wire corrosion resistance | 500 hr | 0 | 0 | 0 |
| Failure ratio (number) | 720 hr | 3 | 0 | 2 |
| $Q_1$ (wt %) |  | 9 | 9 | 8 |
| $Q_2$ (wt %) |  | 42 | 42 | 43 |

|  | Ex. 21 | Ex. 22 | Ex. 23 |
|---|---|---|---|
| Epoxy resin 1 (wt %) |  |  |  |
| Epoxy resin 2 (wt %) |  |  | 5.23 |
| Epoxy resin 3 (wt %) |  |  |  |
| Epoxy resin 4 (wt %) |  |  |  |
| Epoxy resin 5 (wt %) |  |  |  |
| Epoxy resin 6 (wt %) |  |  |  |
| Epoxy resin 7 (wt %) |  |  |  |

TABLE 5-continued

|  |  |  |  |  |
|---|---|---|---|---|
| Epoxy resin 8 (wt %) |  | 32.07 | 25.00 |  |
| Phenolic resin 1 (wt %) |  |  |  |  |
| Phenolic resin 2 (wt %) |  |  |  | 3.97 |
| Phenolic resin 3 (wt %) |  |  |  |  |
| Phenolic resin 4 (wt %) |  |  |  |  |
| Phenolic resin 5 (wt %) |  | 35.59 | 27.74 |  |
| Amine-based curing agent 1 (wt %) |  |  |  |  |
| OH/Ep |  | 1.0 | 1.0 | 1.0 |
| Fused flake silica (wt %) |  | 30.0 | 45.0 |  |
| Fused spherical silica (wt %) |  |  |  | 90.0 |
| Carnauba wax (wt %) |  |  |  | 0.13 |
| T.P.P. (wt %) |  |  |  | 0.10 |
| D.B.U. (wt %) |  | 0.34 | 0.26 |  |
| Silane coupling agent (wt %) |  | 2.0 | 2.0 | 0.39 |
| Carbon black (wt %) |  |  |  | 0.18 |
| Flexural modulus at 240° C. (kgf/mm$^2$) |  | ○ 11.3 | ○ 12.9 | ○ 81.0 |
| Flame retardancy |  | V-1 | V-1 | V-0 |
| ΣF (sec) |  | 62 | 53 | 4 |
| Observation of section after combustion |  | ○ | ○ | ○ |
| Solder crack resistance (number) | 80 hr | — | — | 0 |
|  | 120 hr | — | — | 0 |
| Humidity resistance | 100 hr | — | — | 0 |
| Failure ratio (number) | 200 hr | — | — | 0 |
| Wire corrosion resistance | 500 hr | — | — | 0 |
| Failure ratio (number) | 720 hr | — | — | 0 |
| Q$_1$ (wt %) |  | 7 | 6 | 11 |
| Q$_2$ (wt %) |  | 44 | 45 | 41 |

TABLE 6

|  |  | Comp. Ex. 1 | Comp. Ex. 2 | Comp. Ex. 3 | Comp. Ex. 4 | Comp. Ex.5 |
|---|---|---|---|---|---|---|
| Epoxy resin 1 (wt %) |  |  |  |  |  |  |
| Epoxy resin 2 (wt %) |  |  |  |  |  |  |
| Epoxy resin 3 (wt %) |  |  |  |  |  |  |
| Epoxy resin 4 (wt %) |  |  |  |  |  |  |
| Epoxy resin 5 (wt %) |  | 26.76 | 23.80 |  | 17.54 |  |
| Epoxy resin 6 (wt %) |  |  |  | 21.60 |  | 15.92 |
| Epoxy resin 7 (wt %) |  |  |  |  |  |  |
| Phenolic resin 1 (wt %) |  |  |  |  |  |  |
| Phenolic resin 2 (wt %) |  |  |  |  |  |  |
| Phenolic resin 3 (wt %) |  | 14.62 | 13.01 |  | 9.59 |  |
| Phenolic resin 4 (wt %) |  |  |  | 15.21 |  | 11.21 |
| OH/Ep |  | 1.0 | 1.0 | 1.0 | 1.0 | 1.0 |
| Fused flake silica (wt %) |  | 55.0 | 60.0 | 60.0 | 70.5 | 70.5 |
| Fused spherical silica (wt %) |  |  |  |  |  |  |
| Carnauba wax (wt %) |  | 0.58 | 0.51 | 0.51 | 0.38 | 0.38 |
| T.P.P. (wt %) |  | 0.46 | 0.40 | 0.40 | 0.30 | 0.30 |
| Silane coupling agent (wt %) |  | 1.77 | 1.57 | 1.57 | 1.16 | 1.16 |
| Carbon black (wt %) |  | 0.81 | 0.71 | 0.71 | 0.53 | 0.53 |
| Flexural modulus at 240° C. (kgf/mm$^2$) |  | x 58.4 | x 75.4 | x 0.7 | x 103.0 | x 2.7 |
| Flame retardancy | | NOT V-2 | NOT V-2 | V-2 | NOT V-2 | V-2 |
| Σ$_F$ (sec) |  | >250 | >250 | Drip | >250 | Drip |
| Observation of section after combustion |  | x1 | x1 | x2 | x1 | x2 |
| Solder crack resistance (number) | 80 hr | — | — | *1 | 5 | *1 |
|  | 120 hr | — | — | *1 | 8 | *1 |
| Humidity resistance | 100 hr | — | 4 | 5 | 3 | 4 |
| Failure ratio (number) | 200 hr | — | 6 | 7 | 5 | 6 |
| Wire corrosion resistance | 500 hr | — | — | — | 5 | 4 |
| Failure ratio (number) | 720 hr | — | — | — | 7 | 7 |
| Q$_1$ (wt %) |  | 10 | 9 | 3 | 10 | 4 |
| Q$_2$ (wt %) |  | 56 | 55 | 95 | 57 | 94 |

*1: A package was molten.

TABLE 7

|  |  | Comp. Ex. 6 | Comp. Ex. 7 | Comp. Ex. 8 | Comp. Ex. 9 | Comp. Ex. 10 |
|---|---|---|---|---|---|---|
| Epoxy resin 1 (wt %) |  |  |  |  |  |  |
| Epoxy resin 2 (wt %) |  |  |  |  |  | 1.18 |
| Epoxy resin 3 (wt %) |  |  |  |  |  |  |
| Epoxy resin 4 (wt %) |  |  |  |  |  |  |
| Epoxy resin 5 (wt %) |  | 11.30 |  | 9.21 |  | 4.72 |
| Epoxy resin 6 (wt %) |  |  | 10.26 |  | 8.36 |  |
| Epoxy resin 7 (wt %) |  |  |  |  |  |  |
| Phenolic resin 1 (wt %) |  |  |  |  |  |  |
| Phenolic resin 2 (wt %) |  |  |  |  |  | 0.66 |
| Phenolic resin 3 (wt %) |  | 6.18 |  | 5.04 |  | 2.64 |
| Phenolic resin 4 (wt %) |  |  | 7.22 |  | 5.89 |  |
| OH/Ep |  | 1.0 | 1.0 | 1.0 | 1.0 | 1.0 |
| Fused flake silica (wt %) |  |  |  |  |  |  |
| Fused spherical silica (wt %) |  | 81.0 | 81.0 | 84.5 | 84.5 | 90.0 |
| Carnauba wax (wt %) |  | 0.24 | 0.24 | 0.20 | 0.20 | 0.13 |
| T.P.P. (wt %) |  | 0.19 | 0.19 | 0.16 | 0.16 | 0.10 |
| Silane coupling agent (wt %) |  | 0.75 | 0.75 | 0.61 | 0.61 | 0.39 |
| Carbon black (wt %) |  | 0.34 | 0.34 | 0.28 | 0.28 | 0.18 |
| Flexural modulus at 240° C. (kgf/mm$^2$) |  | x 139.8 | x 4.7 | x 150.6 | x 5.4 | x 155.2 |
| Flame retardancy |  | NOT V-2 | V-2 | NOT V-2 | V-2 | V-1 |
| Σ$_F$ (sec) |  | >250 | Drip | >250 | Drip | 112 |
| Observation of section after combustion |  | x1 | x2 | x1 | x2 | x1 |
| Solder crack resistance (number) | 80 hr | 4 | *1 | 3 | *1 | 2 |
|  | 120 hr | 7 | *1 | 5 | *1 | 4 |
| Humidity resistance | 100 hr | 2 | 2 | 1 | 1 | 1 |
| Failure ratio (number) | 200 hr | 4 | 5 | 3 | 3 | 2 |
| Wire corrosion resistance | 500 hr | 4 | 3 | 3 | 2 | 2 |
| Failure ratio (number) | 720 hr | 6 | 6 | 5 | 4 | 3 |
| Q$_1$ (wt %) |  | 10 | 3 | 10 | 4 | 9 |
| Q$_2$ (wt %) |  | 56 | 95 | 57 | 94 | 55 |

*1: A package was molten.

TABLE 8

|  | Comp. Ex. 11 | Comp. Ex. 12 | Comp. Ex. 13 | Comp. Ex. 14 | Comp. Ex. 15 |
|---|---|---|---|---|---|
| Epoxy resin 1 (wt %) |  |  |  |  |  |
| Epoxy resin 2 (wt %) |  |  |  |  |  |
| Epoxy resin 3 (wt %) |  |  |  |  |  |
| Epoxy resin 4 (wt %) |  |  |  |  |  |
| Epoxy resin 5 (wt %) |  |  |  | 2.97 |  |
| Epoxy resin 6 (wt %) |  |  |  |  |  |
| Epoxy resin 7 (wt %) |  |  |  |  | 11.94 | 9.42 |
| Epoxy resin 8 (wt %) | 53.09 | 41.38 |  |  |  |
| Phenolic resin 1 (wt %) |  |  |  |  |  |
| Phenolic resin 2 (wt %) |  |  |  |  |  |
| Phenolic resin 3 (wt %) |  |  | 1.63 | 3.54 | 2.83 |
| Phenolic resin 4 (wt %) |  |  |  |  |  |
| Phenolic resin 5 (wt %) |  |  |  |  |  |
| Amine-based curing agent 1 (wt %) | 14.91 | 11.62 |  |  |  |
| OH/Ep | 1.0 | 1.0 | 1.0 | 1.0 | 1.0 |
| Fused flake silica (wt %) | 30.0 | 45.0 |  |  |  |
| Fused spherical silica (wt %) |  |  | 95.0 | 81.0 | 84.5 |
| Carnauba wax (wt %) |  |  | 0.06 | 0.24 | 0.20 |
| T.P.P. (wt %) |  |  | 0.05 | 0.19 | 0.16 |
| D.B.U. (wt %) |  |  |  |  |  |
| Silane coupling agent (wt %) | 2.0 | 2.0 | 0.20 | 0.75 | 0.61 |
| Carbon black (wt %) |  |  | 0.09 | 0.34 | 0.28 |
| Diantimony trioxide (wt %) |  |  |  | 2.0 | 2.0 |

TABLE 8-continued

|  | Comp. Ex. 11 | Comp. Ex. 12 | Comp. Ex. 13 | Comp. Ex. 14 | Comp. Ex. 15 |
|---|---|---|---|---|---|
| Flexural modulus at 240° C. (kgf/mm$^2$) | x 45.4 | x 48.1 | x 189.5 | x 145.1 | x 161.2 |
| Flame retardancy | NOT V-2 | NOT V-2 | V-1 | V-0 | V-0 |
| $\Sigma_F$ (sec) | >250 | >250 | 98 | 10 | 6 |
| Observation of section after combustion | x1 | x1 | x1 | x1 | x1 |
| Solder crack resistance (number) 80 hr | — | — | 8 | 7 | 5 |
| 120 hr | — | — | 10 | 10 | 7 |
| Humidity resistance Failure ratio (number) 100 hr | — | — | 3 | 2 | 2 |
| 200 hr | — | — | 8 | 4 | 3 |
| Wire corrosion resistance Failure ratio (number) 500 hr | — | — | 4 | 10 | 10 |
| 720 hr | — | — | 7 | 10 | 10 |
| Q$_1$ (wt %) | 8 | 7 | 10 | 7 | 8 |
| Q$_2$ (wt %) | 61 | 62 | 56 | 52 | 53 |

We claim:

1. A flame retardant epoxy resin composition comprising an epoxy resin (A), a phenolic resin (B), an inorganic filler (C) and a curing accelerator (D):
wherein
said composition is composed of the inorganic filler (C) and resin components other than the inorganic filler (C) that are comprising the epoxy resin (A), the phenolic resin (B) and the curing accelerator (D), but said composition comprises no flame retardant material nor flame retardant auxiliary;
said composition contains the inorganic filler (C) in the equal amount to a content of W (wt %) for the inorganic filler (C) in a cured article being obtainable by curing the composition, wherein the W (wt %) is selected in range of 60<W≦95;
the phenolic resin (B) is one or a mixture of two or more phenolic resins containing biphenyl derivative having no hydroxyl group in the molecule represented by formula (10):

(10)

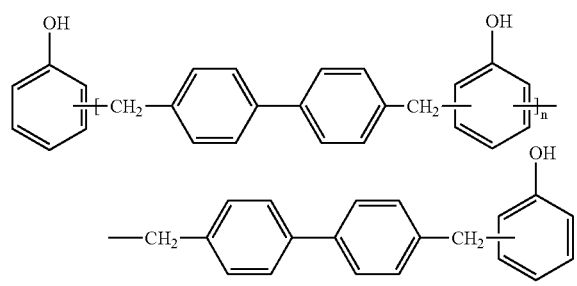

wherein n=0 to 10,
the epoxy resin (A) is a mixture of a phenolbiphenylaralkyl epoxy resin containing a biphenyl derivative having no epoxy group in the molecule represented by formula (2):

(2)

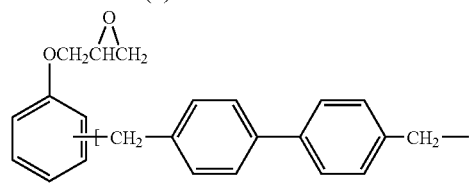

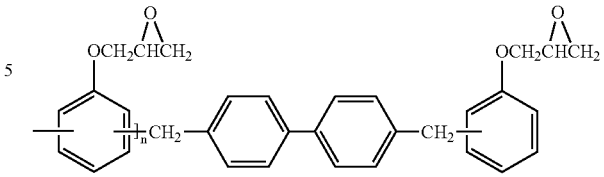

wherein n=0 to 10, and
a tetraphenylolethane epoxy resin consisting essentially of an epoxy resin represented by formula (3):

(3)

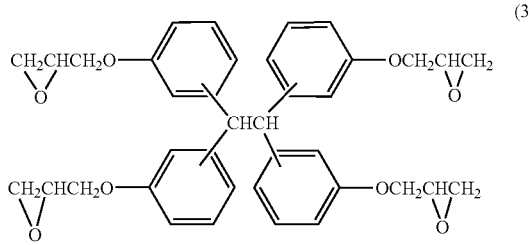

wherein the ratio of the tetraphenylolethane epoxy resin consisting essentially of an epoxy resin represented by formula (3) to the phenolbiphenylaralkyl epoxy resin of formula (2) is ⅕,
the inorganic filler (C) is one or a mixture of two or more fillers selected from the group consisting of fused silica, crystalline silica, or silicon nitride, and
a ratio (OH/Ep) of a phenolic hydroxyl group number (OH) of the total phenolic resin to an epoxy group number (Ep) of the total epoxy resin is 1.0≦(OH/Ep) ≦2.5;
the moiety of the biphenyl derivative having no hydroxyl group is included in a crosslinked structure of the cured article; and
a flexural modulus E (kgf/mm$^2$) at 240±20° C. of the cured article is a value satisfying 0.30 W−13≦E≦3.7 W−184 in the case of 60<W≦95, and the cured article forms a foamed layer during thermal decomposition or at ignition to exert flame retardancy.

2. The epoxy resin composition according to claim 1, wherein the flexural modulus E (kgf/mm$^2$) at 240±20° C. of the cured article is a value satisfying 0.30 W−10≦E≦3.7 W−199 value in the case of 60<W≦95.

3. The epoxy resin composition according to claim 2, wherein the ratio (OH/Ep) is 1.0.

4. The epoxy resin composition according to claim 3, wherein the epoxy resin (A) is a combinational mixture of a phenolbiphenylaralkyl epoxy resin represented by formula (2):

(2)

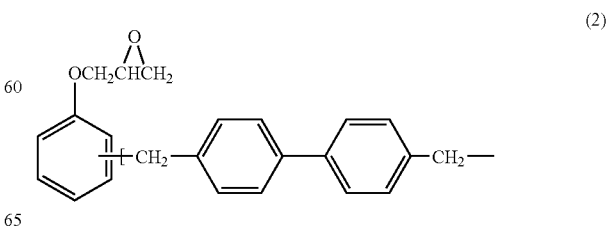

-continued

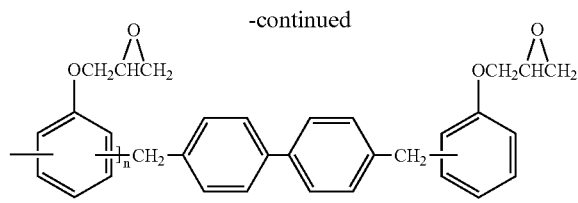

wherein n=0 to 10, with a tetraphenylolethane epoxy resin represented by formula (3):

(3)

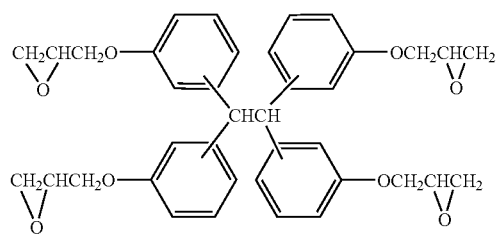

and the phenolic resin (B) is a phenolbiphenylaralkyl resin represented by formula (10):

(10)

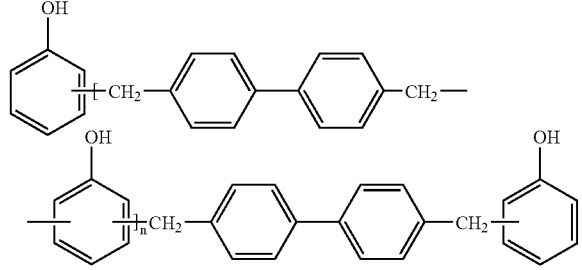

wherein n=0 to 10.

5. A semiconductor device in which the epoxy resin composition described in claim 1 is used as an encapsulating resin.

6. The epoxy resin composition according to claim 1, wherein the W (wt %) is selected in range of 60<W<87.

* * * * *

UNITED STATES PATENT AND TRADEMARK OFFICE
CERTIFICATE OF CORRECTION

PATENT NO.        : 7,098,276 B1
APPLICATION NO. : 09/830016
DATED             : August 29, 2006
INVENTOR(S)       : Yukihiro Kiuchi et al.

It is certified that error appears in the above-identified patent and that said Letters Patent is hereby corrected as shown below:

On the title page, below Item (87), add Item (30) as follows:

Item --(30)    Foreign Application Priority Data

October 21, 1998    (JP) ..........................10-299606--.

Signed and Sealed this

Twenty-eighth Day of August, 2007

JON W. DUDAS
*Director of the United States Patent and Trademark Office*